United States Patent
Kuriya

(10) Patent No.: US 7,687,390 B2
(45) Date of Patent: Mar. 30, 2010

(54) MANUFACTURING METHOD OF A TRANSPARENT CONDUCTIVE FILM, A MANUFACTURING METHOD OF A TRANSPARENT ELECTRODE OF AN ORGANIC ELECTROLUMINESCENCE DEVICE, AN ORGANIC ELECTROLUMINESCENCE DEVICE AND THE MANUFACTURING METHOD

(75) Inventor: Yutaka Kuriya, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 738 days.

(21) Appl. No.: 11/607,379

(22) Filed: Nov. 30, 2006

(65) Prior Publication Data

US 2007/0231939 A1    Oct. 4, 2007

(30) Foreign Application Priority Data

Mar. 28, 2006  (JP) .............................. 2006-086952
May 30, 2006  (JP) .............................. 2006-149443
Jul. 19, 2006  (JP) .............................. 2006-196688

(51) Int. Cl.
*H01L 21/283* (2006.01)

(52) U.S. Cl. ........................... 438/609; 438/22; 438/99; 438/584; 438/597; 257/E21.294; 257/E21.295; 257/E21.299; 257/E21.476; 257/E21.477

(58) Field of Classification Search .................. 438/22, 438/99, 584, 597, 609; 257/E21.294, E21.295, 257/E21.299, E21.476, E21.477
See application file for complete search history.

(56) References Cited

U.S. PATENT DOCUMENTS 5,175,608 A * 12/1992 Nihei et al. .................. 257/751
5,232,571 A *  8/1993 Braymen ............... 204/192.22
5,527,605 A *  6/1996 Doessel et al. .............. 428/332
6,420,200 B1  7/2002 Yamazaki et al.
6,582,504 B1  6/2003 Fujita
7,404,879 B2 *  7/2008 Tolmachev et al. ..... 204/298.02

(Continued)

FOREIGN PATENT DOCUMENTS

JP    05-078655    3/1993

(Continued)

OTHER PUBLICATIONS

Yamamori et al., "Transparent organic light-emitting diodes using metal acethylacetonate complexes as an electron injective buffer layer," Applied Physics Letters, vol. 78, No. 21, May 21, 2001, pp. 3343-3345.

*Primary Examiner*—Kiesha R Bryant
*Assistant Examiner*—Minchul Yang
(74) *Attorney, Agent, or Firm*—Squire, Sanders & Dempsey, L.L.P.

(57) ABSTRACT

In one embodiment of a manufacturing method of a transparent conductive film of the present invention, a grid having a magnet is placed between a target and a substrate, and a pattern shaped transparent conductive film comprising the target material is formed over the substrate through a mask by a sputtering method. In other embodiment of a manufacturing method of a transparent conductive film of the present invention, a mask is placed on a substrate, a pattern shaped transparent conductive layer comprising a target material is formed on the substrate by a sputtering method, and a trap electrode having a magnet pin is installed between the target and the substrate.

7 Claims, 14 Drawing Sheets

U.S. PATENT DOCUMENTS

2004/0021413 A1    2/2004    Ito et al.

FOREIGN PATENT DOCUMENTS

| | | |
|---|---|---|
| JP | 10-012377 | 1/1998 |
| JP | 10-077467 | 3/1998 |
| JP | 11-024604 | 1/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |
| JP | 2002-313561 | 10/2002 |
| JP | 2003-059654 | 2/2003 |
| JP | 2003-059656 | 2/2003 |
| JP | 2003-243163 | 8/2003 |
| JP | 2003-282244 | 10/2003 |
| JP | 2004-055333 | 2/2004 |
| JP | 2004-063359 | 2/2004 |
| JP | 2004-355913 | 12/2004 |
| WO | WO 99/10862 | 4/1999 |

* cited by examiner

MANUFACTURING METHOD OF A TRANSPARENT CONDUCTIVE FILM, A MANUFACTURING METHOD OF A TRANSPARENT ELECTRODE OF AN ORGANIC ELECTROLUMINESCENCE DEVICE, AN ORGANIC ELECTROLUMINESCENCE DEVICE AND THE MANUFACTURING METHOD

CROSS REFERENCE

This application claims priority to Japanese application number 2006-86952, filed on Mar. 28, 2006, priority to Japanese application number 2006-149443, filed on May 30, 2006 and priority to Japanese application number 2006-196688, filed on Jul. 19, 2006, which are incorporated herein by reference.

BACKGROUND OF THE INVENTION

1. Field of the Invention

The present invention is related to a formation method of a transparent electrode by a sputtering method. In addition, the present invention is related to an organic electroluminescence device and the manufacturing method.

2. Description of the Related Art

The field of application of a transparent conductive film is in optical communication, semiconductor laser, various display units, storage media, and apparatus for home use (a digital camera, a projector, a portable telephone, an optical lens, a mirror and a lamp). About a transparent conductive film, there are the following requests:

1. Stability in mass production such as yield improvement; and

2. Performance as a film in case of formation of a multilayer film.

An organic electroluminescence device is explained below. An organic luminescent layer is sandwiched between two electrodes. An organic luminescent layer emits light by electrifying between electrodes. An electrode in one side has to be transparent to take out light. It is proposed that a transparent conductive film comprising indium/tin oxides (ITO) is used as a transparent electrode (patent references 1, 2, 3 and 4).

As for the top emission type organic electroluminescence device, an electrode in the opposite side of a substrate is a transparent electrode. In a top emission type organic electroluminescence device, protection of a cathode and reduction of wiring resistance by forming a transparent conductive film on a metallic thin film are proposed. In addition, when a transparent conductive film is used as a cathode, for protection of an organic luminescent layer and reduction of an electron injection barrier, it is proposed that a buffer layer is inserted between an organic luminescent layer and a transparent conductive film.

Evaporation method, assist evaporation method by plasma and ion beam, ion plating method and ion beam sputter are used mainly as a manufacturing method of a transparent conductive film. In addition, a wet method such as a sol/gel method or a spray method can be used. On the other hand, a sputtering method is used in a mass production apparatus used for thin film manufacturing process of a semi-conductor, a flat panel display or an electronic component or the like.

A sputtering method is widely used as a method suitable for mass production from the following reasons:

1. A deposition rate or a film composition is stable; and

2. Uniform film formation to a substrate of large area is possible.

In addition, from the following reasons, a sputtering method is the mainstream method:

1. Uniformity of film thickness, conductivity and transparency is high; and

2. Fine etching property is good.

Characteristic of a sputtering method is described below.

When energy of the particle which is incident on a substrate is equal to or more than a 50 eV level, by the following phenomenon, problems such as impurity pollution or roughness of thin film generally occur:

1. A particle gets in the substrate;

2. Atom comprising the substrate is sputtered; and

3. Defect of a substrate occurs.

On the other hand, in methods such as evaporation method, film formation is performed only by thermal energy. Therefore, energy of an incident particle is at 0.1 eV level. Therefore, sufficient migration in a substrate surface is unable. Therefore, deposited film by particle adhesion is not dense. In addition, bonding strength of substrate-film interface is low and the bonding is unstable.

Energy of a sputter particle deposited on a substrate is much bigger than energy of a particle in a vacuum evaporation method. In the case of an evaporation method, particle energy is at 0.1 eV level. In the case of a sputtering method, particle energy is at 600 eV level. Therefore, when film formation on an organic thin film is performed by a sputtering method, break of molecular structure of a film occurs by scattering/crash of recoil Ar plasma, γ electron, the target particle or the like which is a high energy particle. Therefore, light emission performance of an organic luminescent material may fall.

On the other hand, when a metal mask is used in a sputtering method, and an electrode pattern is formed, from the following phenomenon, thermal expansion of a mask occurs and a mask may bend:

1. Radiant heat of a target surface by confined plasma; and

2. The secondary electron which is incident on the mask surface by end loss of plasma.

TABLE 1

| Material | Composition | Thermal expansion coefficient | Magnetic properties |
|---|---|---|---|
| 42Alloy | Fe—42Ni | 4.6e–6/° C. | Paramagnetism |
| SUS316 | Fe—18Cr—8Ni—Mo | 15.9e–3/° C. | Nonmagnetism |
| SUS304 | Fe—18Cr—8Ni | 17.3e–6/° C. | Nonmagnetism |
| Invar | Fe—Ni | 3.5e–6/° C. | |
| Kovar | Fe—Ni—Co | equivalent to invar | |
| Super Invar(MA-INV36/MA-S-INVER) | — | 1.0e–6/° C. | |

Material of low thermal expansion is used for a mask material with respect to the problem, and a bend of a mask is suppressed. For example, austenitic stainless steels and invar materials as shown in TABLE 1 are used.

Patent reference 1: Japanese Patent Laid-Open No. 2003-901158 Official Gazette

Patent reference 2: Japanese Patent Laid-Open No. 2001-250678 Official Gazette

Patent reference 3: The 2,850,906th Patent Official Gazette

Patent reference 4: Japanese Patent Laid-Open No. 2005-68501 Official Gazette

Patent reference 5: Japanese Patent Laid-Open No. 2001-176670 Official Gazette

In manufacture of a top emission type organic electroluminescence device, establishment of a transparent electrode film formation technique having the following characteristic is important:

1. Wiring resistance is low; and

2. Visible light transparency of wiring resistance is high.

The present invention uses a sputtering mask made of material of low thermal expansion and high electric insulation as a mask of forming transparent electrode pattern. For example, aluminum nitride ceramics (AlN) is used.

For a material of the mask, a material which is superior to machinability and is light-weight is desirable in order to form a highly minute pattern in a thin sheet.

In a top emission type organic electroluminescence device, a metal electrode, an organic thin film and a transparent electrode is layered in this order on a glass substrate. Color filter can be affixed to a sealing substrate side of this top emission type organic electroluminescence device. In addition, when a top emission type organic electroluminescence device is used as an active matrix drive display unit, light is not obstructed by a driving circuit in a substrate. Therefore, incrementation of open area ratio can be expected.

In a sputter process, an electrode material is an insulating material, and RF magnetron sputtering is used. Because RF magnetron sputtering is high energy process, in the case of film formation on an organic thin film, film formation in an extended period by low power must be performed. Because recoil Ar plasma, γ electron and an accelerated target particle collide to an organic thin film, an organic thin film can be damaged.

SUMMARY OF THE INVENTION

In one embodiment of a manufacturing method of a transparent conductive film of the present invention, a grid having a magnet is placed between a target and a substrate, and a pattern shaped transparent conductive film comprising the target material is formed over the substrate through a mask by a sputtering method. In other embodiment of a manufacturing method of a transparent conductive film of the present invention, a mask is placed on a substrate, a pattern shaped transparent conductive layer comprising a target material is formed on the substrate by a sputtering method, and a trap electrode having a magnet pin is installed between the target and the substrate.

Figure 1:
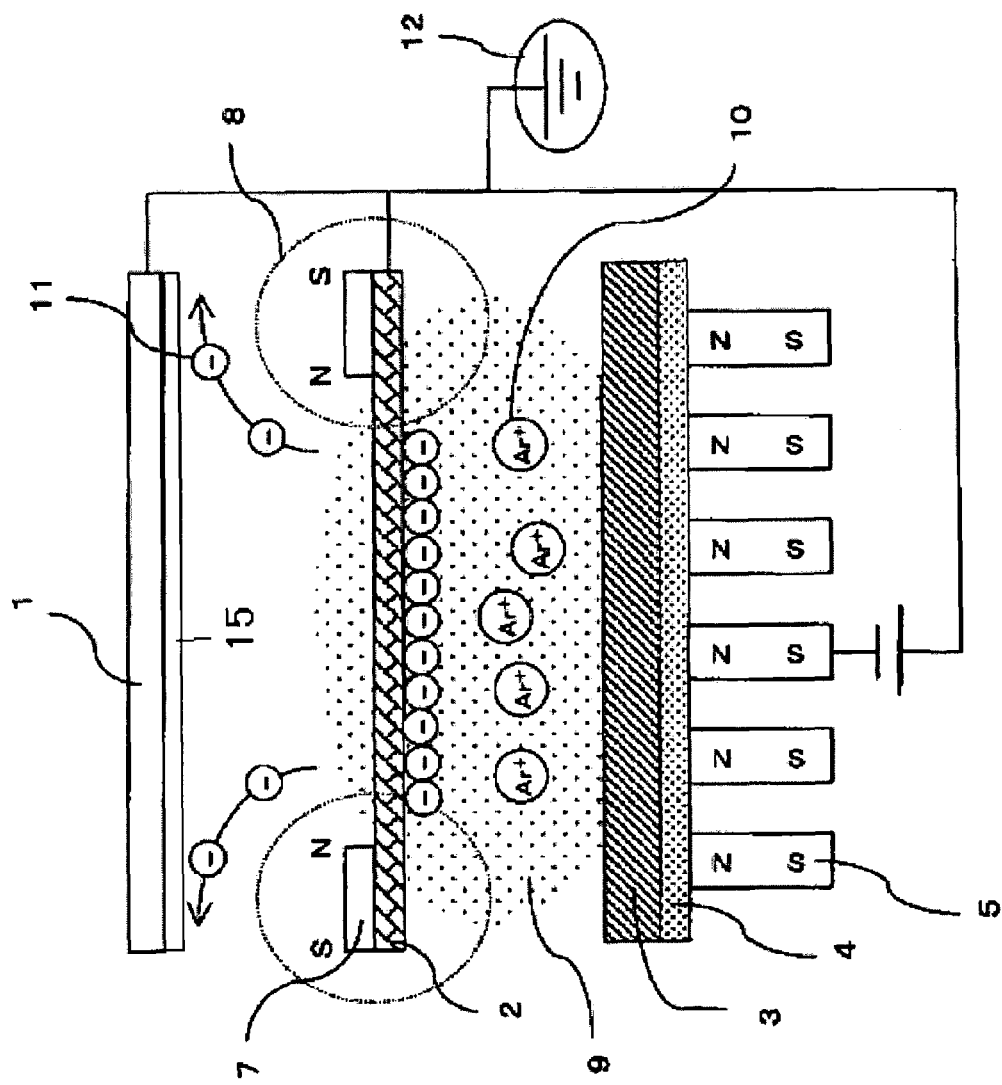
FIG. 1 is a schematic view of a DC magnetron sputtering apparatus used for a manufacturing method of a transparent conductive film of the present invention.

In these drawings, 1 is a substrate; 2 is a grid; 3 is a target; 4 is a backing plate; 5 is a cathode magnet; 6 is a magnet mounting jig; 7 is a magnet; 8 is a line of magnetic force (repulsive magnetic field); 9 is a plasma; 10 is an Ar ion; 11 is a secondary electron; 12 is ground; 13 is a Peltier element; 14 is a magnet folder; 15 is a mask; 15a is a opening of a mask; 17 is a mask frame; 20 is a substrate; 21 is a reflective electrode (a first electrode); 22 is a partition wall; 23 is a hole transport layer; 24a is a red (R) organic luminescent layer; 24b is a green (G) organic luminescent layer; 24c is a blue (B) organic luminescent layer; 25 is an electron injection protective layer; 26 is a transparent electrode (a second electrode); 27 is a barrier layer; 28 is a resin layer; 29 is a sealing substrate; 30 is a transparent substrate; 31 is a transparent electrode; 41 is a lead wire; 42 is a ceramic substrate; 43 is a metal electrode; 44a is a p-type semiconductor; 44b is a n type semiconductor; 51 is a main body frame; 52 is a blanket cylinder; 53 is a blanket; 54 is a printing stage; 56 is a substrate: 57 is ink; 59 is a relief printing plate; L is luminescence; 61 is a substrate; 62 is a trap electrode; 63 is a magnet pin; 64 is a 2 points polarity switching device (a trap); 65 is plasma; 66 is a γ electron; 67 is an Ar ion; 68 is a line of magnetic force; 69 is Larmor radius; 70 is a target; 71 is a backing plate (OFC); 72 is a cathode magnet; 73 is a chiller; 74 is ground; 85 is a substrate; 86 is a reflective electrode (a first electrode); 87 is a partition wall; 88 is a hole transport layer; 89a is a red (R) organic luminescent layer; 89b is a green (G) organic luminescent layer; 89c is a blue (B) organic luminescent layer; 92 is an electron injection protective layer; 93 is a transparent electrode (second electrode); 94 is a barrier layer; 95 is a resin layer; 96 is a sealing substrate; 101 is an ink replenishing device; 102 is a doctor; 103 is an anilox roll; 104 is a relief printing plate; 105 is a printing cylinder; 106 is a substrate; 107 is a stage; 108 is ink; 108a is an ink pattern; 201 is a mask pattern (a transparent electrode); 202 is a mask for sputtering; 203 is a mask locking screw; 204 is an adjustment part of an incidence angle of a sputtering particle; 205 is a permanent magnet for magnetic field formation; 206 is a glass substrate; 207 is a line of magnetic force; 208 is Ar plasma; 209 is an Ar ion; 210 is a secondary electron moving direction; 211 is a shutter board; 212 is a target; 213 is a backing plate (OFC); 214 is a cathode magnet; 215 is a flow path; 216 is a mask frame; and 217 is a crosspiece.

DESCRIPTION OF THE PREFERRED EMBODIMENTS

The first embodiment of the present invention is described below.

Field of application of a transparent conductive film of the present invention is wide. Especially, when it is used as an electrode for optoelectronics devices, an electrode must satisfy a request based on working conditions of various kinds of devices.

Especially, a formation material of a transparent conductive film must satisfy both electrical characteristic and optical qualities in a visible light area. For a transparent conductive film formation material in the present invention, ITO, $SnO_2$, AZO, GZO or IZO can be used.

In addition, material of CdO system and gallium oxide system can be used. However, practical use of CdO system is difficult because Cd has the toxicity. In transparent conductive film of gallium oxide system, there is wide band gap. However, same as indium, gallium is not abundant resources. As thus described, in a select of a formation material of a transparent conductive film, atmosphere must be considered.

A mother crystal of ITO is $In_2O_3$. ITO ($In_2O_3$:Sn) to which 5-10 wt % Sn (in the conversion to oxide) is added has high conductivity ($10 \times 10^3$ S/cm) and high transparence.

A manufacturing method of a transparent conductive film of the present invention is described below.

The present invention is a method of forming a transparent electrode on a substrate by a sputtering method. For a sputtering method, ion beam sputter, direct current sputtering technique, radio frequency sputter or magnetron sputtering method can be used.

Magnetron sputtering is explained below. In magnetron sputtering, current density is high. An ion of high energy (about 600 eV) collides with electron. Therefore, transparent conductive film can be layered with high-speed. In addition, because an atmosphere is in low pressure, a mean free path of a sputtering particle is long. Therefore, a sputter particle deposits on a substrate facing a target. This process is high energy process. Therefore, when a transparent conductive film is layered on an organic thin film, recoil Ar plasma, γ electron and an accelerated target particle collide to an organic thin film. Therefore, an organic thin film can be damaged.

A schematic view of a DC magnetron sputtering apparatus used for transparent conductive film formation of the present invention is shown in FIG. 1. Grid 2 is installed between substrate 1 and target 3. Grid 2 has magnet 7. In addition, target 3 is fixed to backing plate (OFC) 4. There is cathode magnet 5 in undersurface of backing plate 4. Inside of the apparatus is in vacuum at film formation. Ground 12 is shown by FIG. 1.

Voltage is applied to grid 2. Then polarity of a plasma charged particle is neutralized. Then capture (extinction) of a plasma charged particle is enabled. Therefore, incident frequency of a plasma charged particle to mask 15 can be decreased. In other words grid 2 acts as a trapping mechanism of a carrier.

In the present invention, grid 2 comprising magnet 7 is installed between target 1 comprising a formation material of a transparent conductive film and a substrate. Then magnetic field is formed. Therefore, a γ electron is attracted by a line of magnetic force formed by a magnet. Then sputter damage by electron collision to a substrate and charge up of a substrate can be suppressed. Especially, when a transparent conductive film is formed on the surface of an organic thin film on a substrate, sputter damage to an organic thin film is reduced. Therefore, transparent conductive film can be nicely formed on an organic thin film.

Line of magnetic force in the present invention is line of magnetic force formed by a magnet put on a grid. Line of magnetic force is circular and radial in establishment point of each magnet. In the present invention, all polarities of magnets in a central side of a grid are same. (Line of magnetic force (repulsive magnetic field) 8 is shown by FIG. 1.)

An Ar ion is a positive ion which is formed when Ar gas of semi-neutral condition is changed to plasma by discharge or the like. (Plasma 9 and Ar ion 10 is shown in FIG. 1.)

The γ electron (secondary electron) is a high energy electron which is released when plasma electron collides Ar gas or target particle. (Secondary electron 11 is shown in FIG. 1.)

Figure 2:
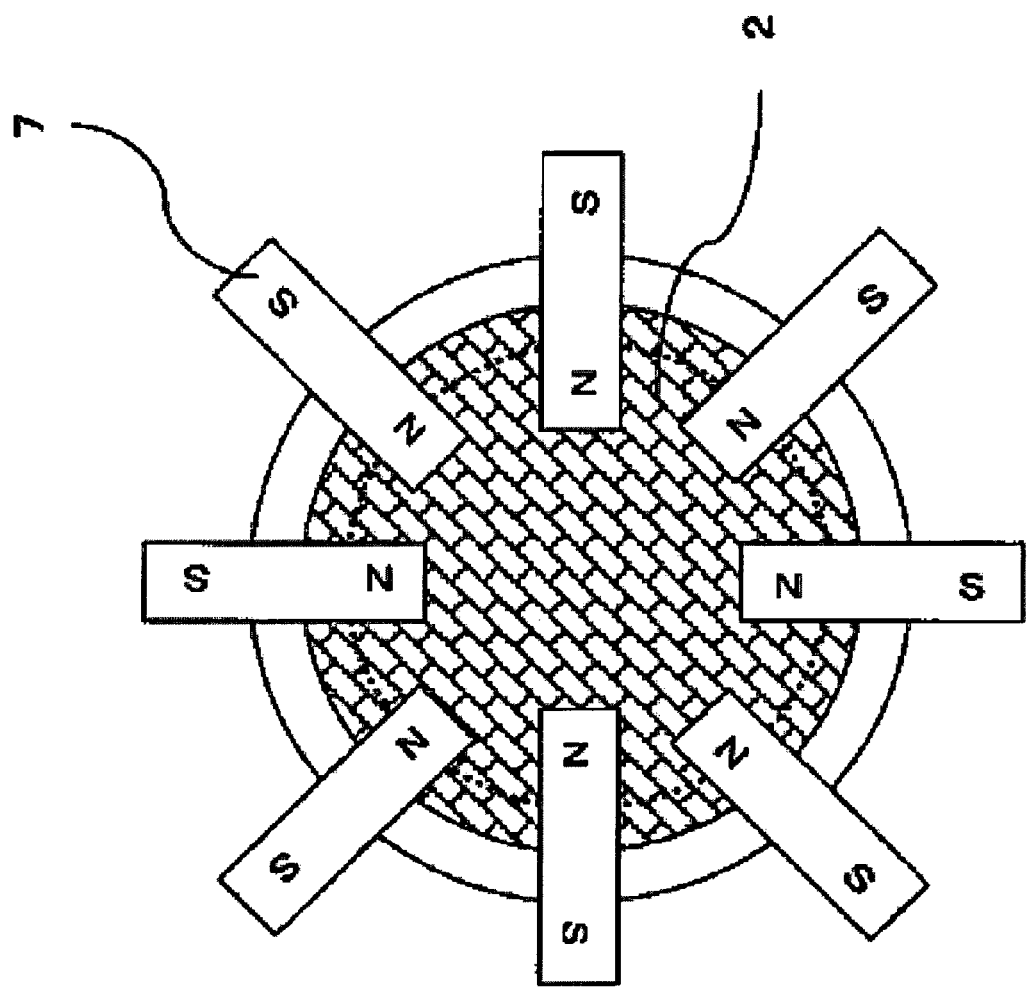
FIG. 2 is a layout drawing of a magnet on a grid.

An example of a layout drawing of a magnet on a grid is shown in FIG. 2. As shown in FIG. 2, magnet 7 is bar-type. Plural magnets are placed on grid 2 radially. Polarities of magnets in central side of a grid should be the same. In this case, repulsive magnetic field is formed efficiently. Line of magnetic force of repulsive magnetic field can attract a part of leaking γ electron from a grid.

For a magnet, a well-known permanent magnet can be used. As for the shape of a magnet, form of bar is preferable. However, a magnet of polygon pillar shape such as a triangular prism or a quadratic prism, column shape and cylindroid shape can be used. When a bar-type magnet is used, plural bar-type magnets may be tied in series. Plural bar-type magnets may be bundled. When plural bar-type magnets are bundled, the number of bar-type magnets can be changed. Therefore, magnetic flux density of the magnets can be changed easily.

Figure 3:
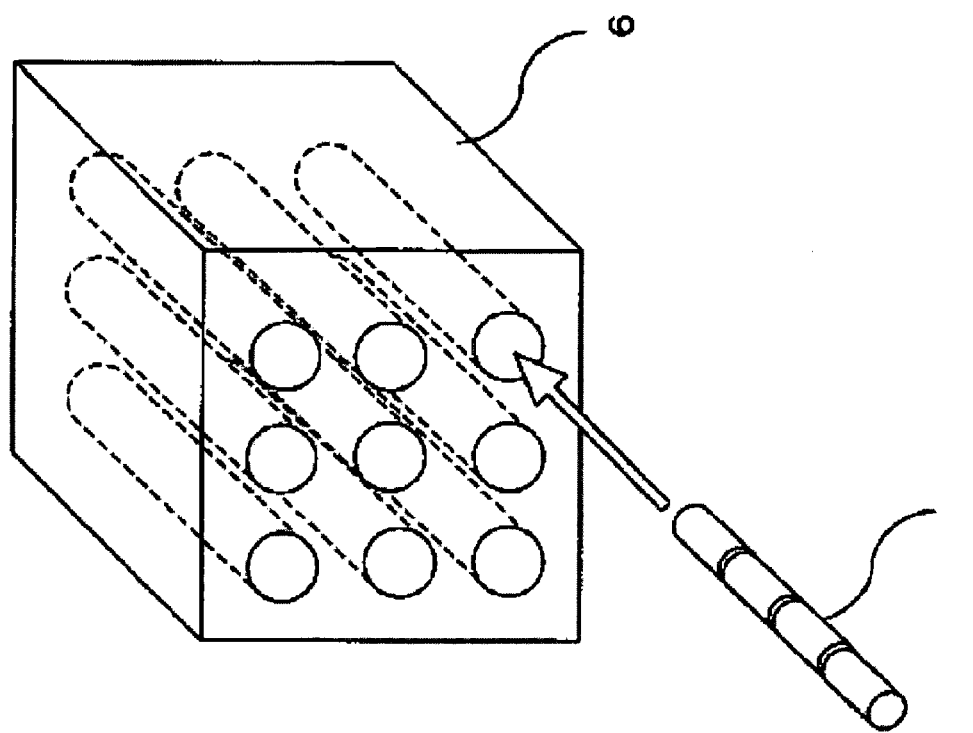
FIG. 3 is a magnet mounting jig bundling up bar-type magnets of an embodiment of the present invention.

Magnet mounting jig 6 bundling plural bar-type magnets 7 is shown in FIG. 3. As shown in FIG. 3, as for the magnet mounting jig, a columnar cavity is formed in non-magnetic material body. One or more bar-type magnet in series can be put in a columnar cavity. In FIG. 3, four bar-type magnets in series are inserted into one cavity. In addition, magnet mounting jig has plural columnar cavities. A magnet can be inserted into each cavity. The magnet mounting jig which a magnet is inserted into is put on a grid.

When each magnet in the magnet bundle is arranged to have the same polar direction, each magnet repels each other. Therefore, it was difficult to make a magnet bundle. When magnet mounting jig of the present invention is used, plural bar-type magnets can be arranged to have the same polar direction in parallel easily. Therefore, magnetic flux density of a magnet can be changed easily.

Magnet mounting jig of the present invention can include non-magnetic material. A well-known material can be used for non-magnetic material. It is desirable to use an Al alloy because an Al alloy is lightweight. A bend of a grid due to weight of a magnet and a magnet mounting jig can be reduced when light magnet mounting jig is placed on a grid.

In addition, a columnar cavity of a magnet mounting jig may be polygon pillar shape such as a triangular prism or a quadratic prism. It may be a cylinder and cylindroid. According to a shape of a bar-type magnet, a shape of cavity is decided appropriately.

Figure 4:
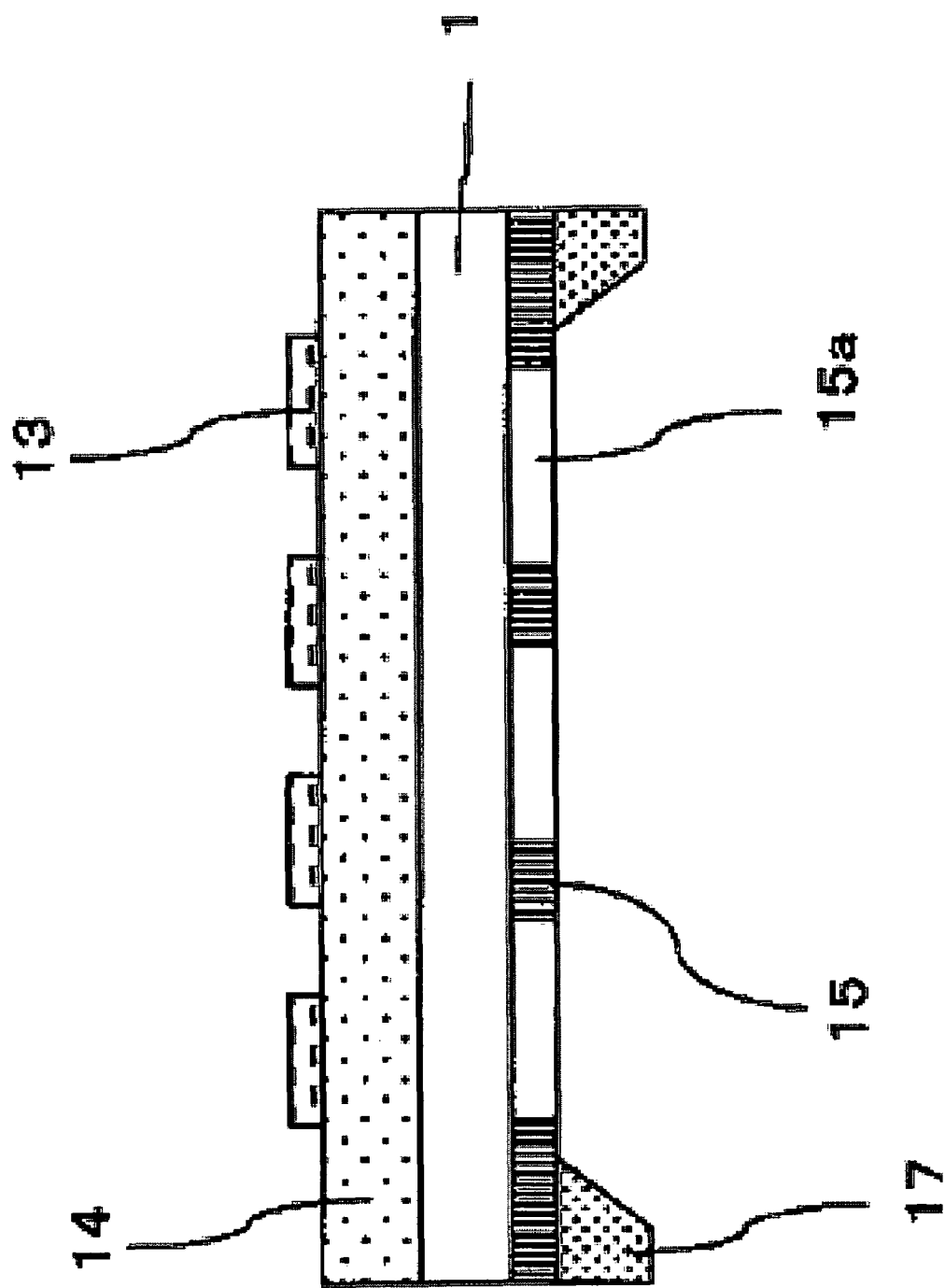
FIG. 4 is a penumbra of a substrate in a manufacturing method of a transparent conductive film of an embodiment of the present invention.

An explanatory drawing of a penumbra of a substrate in formation method of a transparent conductive film is shown in FIG. 4. Substrate 1 is sandwiched between mask 15 with mask frame 17 and magnet holder 14. According to a shape of opening 15*a* of a mask, a pattern of a transparent conductive film is formed on substrate 1. Substrate may be cooled by Peltier element 13 during formation of a transparent conductive film. Peltier element 13 is placed on magnet holder 14.

A substrate and a mask can be cooled easily by putting Peltier element (a semiconductor device) on a substrate. When Peltier element is placed, large-scaled remodeling of an apparatus is unnecessary.

Figure 5:
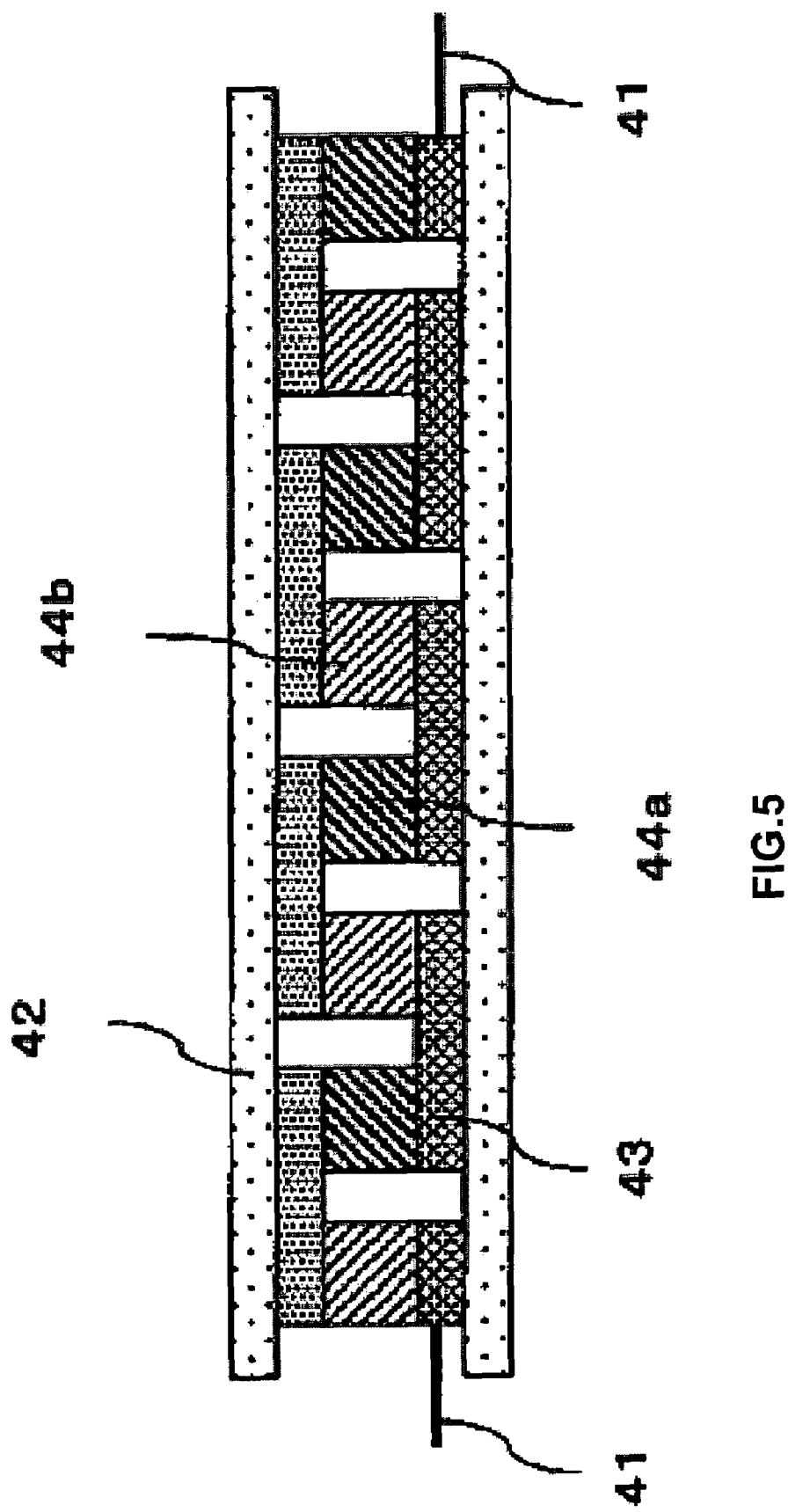
FIG. 5 is a sectional view of a Peltier element.

Peltier element is explained below. When a P-type semiconductor and an N-type semiconductor are used, a thermoelectric power of a P-type semiconductor is plus, and thermoelectric power of an N-type semiconductor is minus. Great thermoelectric effect is achieved because the relative thermoelectric power is very high. A sectional drawing of Peltier element is shown in FIG. 5. P-type semiconductor 44a and N-type semiconductor 44b are arranged in 11 shape through metal electrode 43 between ceramic substrates 42. Lead wire 41 is shown in FIG. 5.

A manufacturing method of an organic electroluminescence device of the present invention is described next. In an organic electroluminescence device of the present invention, a first electrode, an organic luminescent layer and second electrode are formed on substrate in this order. In addition, a hole transport layer, a hole injection layer, an electron transport layer, an electron injection layer or a charge generation layer are installed as a light emission assist layer between a first electrode and a second electrode if necessary. In addition, sealing is performed to protect both electrodes and an organic luminescent layer from moisture in atmosphere.

The following sealing method can be used:

1. Method of affixing a glass cap and a metal cap to a substrate; and

2. Method of coating the substrate, on which a first electrode, an organic luminescent layer and a second electrode are formed, by a barrier layer.

In addition, one electrode among a first electrode and a second electrode is an anode, and another is a cathode.

In a bottom emission type, a layer in the substrate side must be transparent in order to transmit light from an organic luminescent layer. In other words a substrate and a first electrode must be transparent.

On the other hand, in a top emission type organic electroluminescence device, a layer in the opposite side of a substrate side must be transparent in order to transmit light from an organic luminescent layer. In other words second electrode must be transparent. In addition, sealing substrate must pass light.

Figure 6:
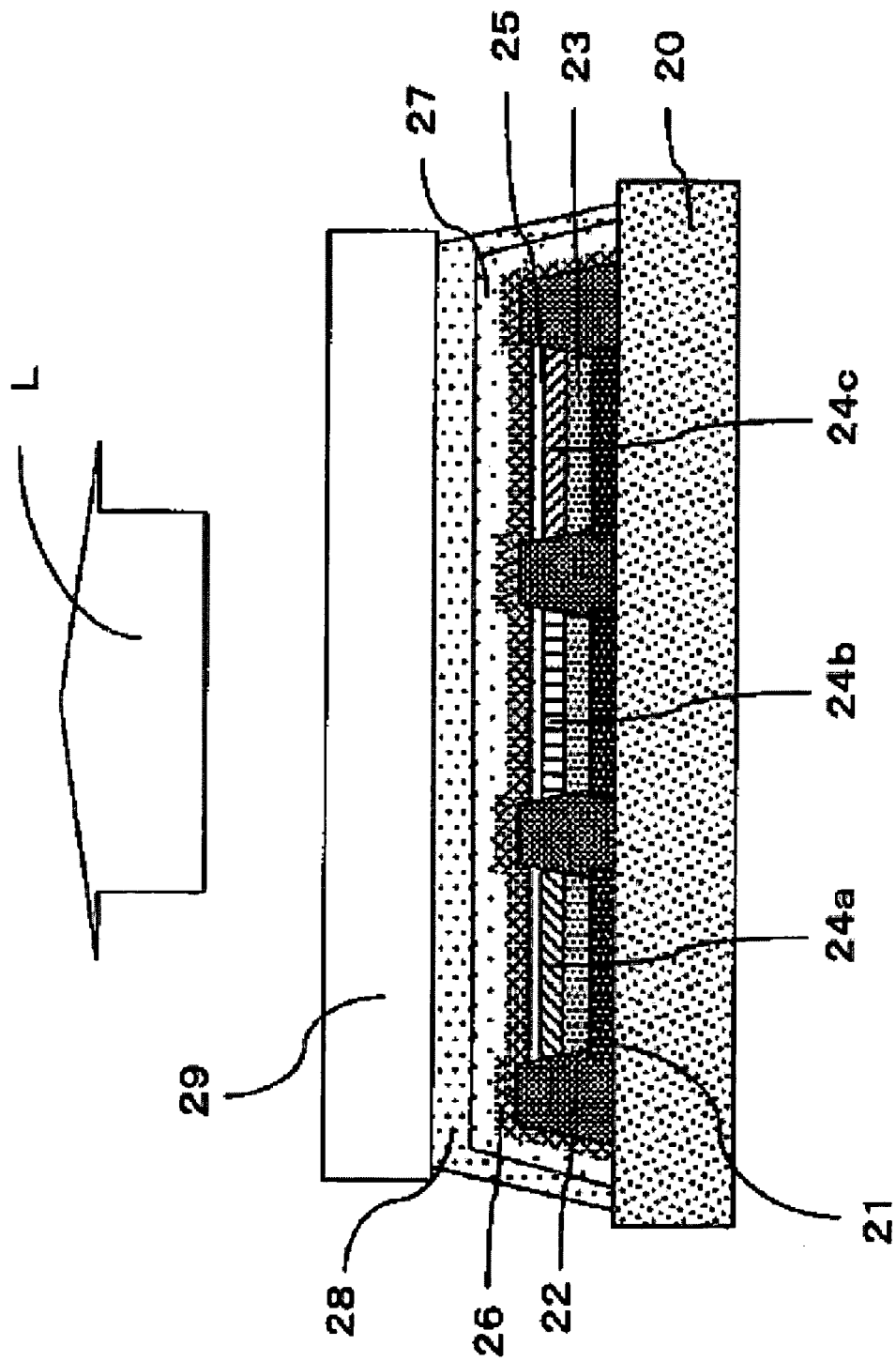
FIG. 6 is a sectional view of a top emission type organic electroluminescence device.

Sectional drawing of a top emission type organic electroluminescence device is shown in FIG. 6. Pattern-shaped reflective electrode 21 is formed on substrate 20 as a first electrode. Partition wall 22 is formed between reflective electrodes 21. Hole transport layer 23 and an organic luminescent layer (24a, 24b, 24c) are formed in this order on reflective electrode 21. Electron injection protective layer 25 and transparent electrode 26 as a second electrode are formed on an organic luminescent layer (24a, 24b, 24c). The substrate on which reflective electrode 21, partition wall 22, hole transport layer 23, organic luminescent layer (24a, 24b, 24c), electron injection protective layer 25 and transparent electrode 26 are formed is sealed by using barrier layer 27, resin layer 28 and sealing substrate 29. Light emission L is shown in FIG. 6.

In a top emission type organic electroluminescence device, a glass substrate and a plastic film or sheet can be used for substrate 20. If plastics film is used, manufacturing of an inexpensive organic electroluminescence device is enabled by a taking-up method. For plastics film material, polyethylene terephthalate, polypropylene, cyclo-olefin polymers, a polyamide, polyethersulfone, polymethyl methacrylate and polycarbonate can be used. In addition, a ceramic evaporation film or other gas barrier property films such as polyvinylidene chloride, polyvinyl chloride or saponified ethylene-vinyl acetate copolymer may be laminated on a surface of the substrate, where an electrode is not formed. In addition, when an active matrix type organic electroluminescence device is made, it is necessary to use TFT substrate comprising thin film transistor (TFT).

An organic electroluminescence device of the present invention can be applied to both a passive matrix type and an active matrix type.

In a passive matrix type organic electroluminescence device, the bigger the number of the stripe electrodes are, the shorter the lighting time in each picture element is. Therefore, momentary emission brightness has to be high in an ON state. When momentary emission brightness is high, an element life time is short. Therefore, a passive matrix type organic electroluminescence device is not suitable for the large capacity display unit of which the number of stripe electrodes is from several hundred to one thousand and several hundred.

On the other hand, in an active matrix type organic electroluminescence device, a switching element and a memory element (an active element) are installed every picture element. Therefore, during one scan period, an active state can be kept. Therefore, even if a display unit is large, momentary emission brightness may be low. Therefore, it is superior in durability. In addition, an active matrix type organic electroluminescence device suits for the moving image display that requires a high-speed response.

Reflective electrode 21 (a first electrode) as an anode can be formed by vacuum film formation methods such as evaporation method or a sputtering method using metallic material such as Mg, Al or Cr. In addition, a reflective electrode may be two layer structure including a reflective electrode such as Mg, Al or Cr and a transparent electrode such as ITO. For this case, ITO is formed as a surface boundary layer of an anode.

After formation of reflective electrode 21, partition wall 22 is formed between reflective electrodes so that partition wall 22 covers an edge of a reflective electrode. It is necessary for a partition wall to have insulating properties. As a partition wall formation material, a photosensitive material can be used. A photosensitive material may be a positive type or a negative type. Novorak resign or polyimide resin can be used. A partition wall is formed by an exposure process and a developing process in photo-lithography method.

Hole transport layer 22 is formed on reflective electrode 21. For a hole transport layer formation material, poly (3,4-ethylenedioxy thiophen)/polystyrene sulfonate (PEDOT/PSS) or the like can be used. Ink is made by dissolving PEDOT/PSS in water. Ink is applied on a substrate by a spin coat method. And ink is dried.

An organic luminescent layer (24a, 24b, 24c) is formed on hole transport layer 22. When an organic electroluminescence device for full color display is made, it is necessary to form pattern-shaped organic luminescent layers of luminescent colors of red (R) green (G) and blue (B) in every picture element respectively. An organic electroluminescence device shown in FIG. 6 has red organic luminescent layer 24a, green organic luminescent layer 24b and blue organic luminescent layer 25b. For a formation material of the organic electroluminescence layer, polyparaphenylene vinylene (PPV) or poly fluorene (PF) can be used. Ink is made by dissolving these organic electroluminescence materials in aromatic system organic solvent such as toluene. Three color patterns are formed using these inks by a printing method.

Figure 8:
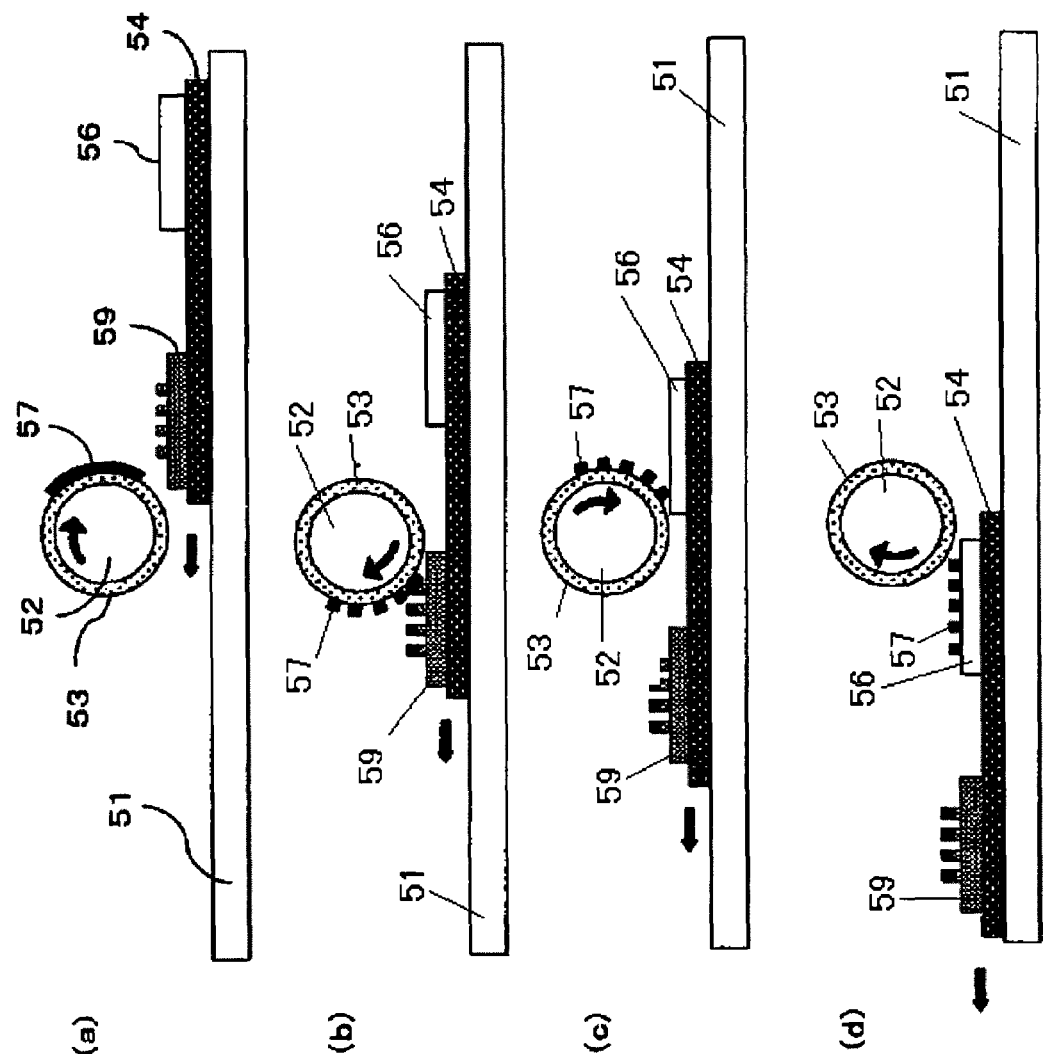
FIGS. 8 (a), (b), (c), and (d) are schematic views of presswork by a letterpress reverse offset printing used in the present invention.

For a printing process, ink jet printing, offset printing or letterpress printing can be used. Especially, a letterpress reverse offset printing is preferable. FIG. 8 shows a schematic view of presswork in a letterpress reverse offset printing.

Blanket 53 is mounted around blanket cylinder 52 over main body frame 51. In addition, printing stage 54 fixes relief printing plate 59 and substrate 56 at the time of printing. In addition, printing stage 54 can move in an uniaxial direction over main body frame 51. In addition, ink 57 is shown in FIG. 8. A first electrode, a partition wall and a hole transport layer are preformed on a substrate.

Ink 57 is applied on blanket 53 beforehand using unillustrated ink supply means by coating method such as curtain coat method, bar coat method, wire coat method and slit coat method (FIG. 8(a)).

A blanket cylinder rotates while printing stage 54 moves. Then, one part of ink layer on blanket 53 is removed by relief printing plate 59. Then, desired pattern shaped ink layer is formed on blanket (FIG. 8 (b)). Then, a blanket cylinder rotates while printing stage 54 moves. Then a pattern shaped ink layer on a blanket transfers on substrate 56. Presswork is finished in this way (FIGS. 8 (c), (d)).

In addition, in a relief reversal offset printing apparatus of FIG. 8, a blanket cylinder is fixed. A stage having a relief printing plate and a substrate moves. However, as for the relief reversal offset printing apparatus of the present invention, a stage may be fixed at printing. A blanket cylinder may move.

For a material of a blanket, a material having flexibility like polymeric film and rubber is desirable. A silicone rubber can be used.

Electron injection protective layer 25 is formed on an organic luminescent layer (24a, 24b, 24c) next. For a formation material of an electron injection protective layer, the rare-earth element of a low work function such as Ca or Ba can be used. An electron injection protective layer is formed by layering the rare-earth element by a vacuum evaporation method.

Transparent electrode 26 is formed as a cathode on electron injection protective layer 25 next. In formation of a transparent electrode, the above-mentioned manufacturing method of a transparent conductive film can be used. For a formation material of a transparent electrode, ITO is preferable. When a transparent electrode of a top emission type organic electroluminescence device is formed, a manufacturing method of a transparent conductive film of the present invention can be used. A manufacturing method of a transparent conductive film of the present invention reduces damage to an organic thin film. Therefore, an organic electroluminescence device superior in luminescence property is obtained.

In addition, in a manufacturing method of a transparent conductive film of the present invention, a temperature rise of a mask at the time of film formation can be controlled. Therefore, thermal expansion and heat deformation of a mask can be controlled. Therefore, precise patterning of a transparent electrode is possible.

In addition, in an organic electroluminescence device of the present invention, a reflective electrode may be a cathode. In addition, a transparent electrode may be an anode.

Substrate 20 having reflective electrode 21, partition wall 22, hole transport layer 23, organic luminescent layer (24a, 24b, 24c), electron injection protective layer 25 and transparent electrode 26 is sealed next. At first barrier layer 27 is formed on the whole area of substrate 20.

For barrier layer 27, silicon-nitride film, oxidation silicon film or nitrided oxidation silicon film can be used. A barrier film is formed by CVD method.

Sealing substrate 29 is stuck on a substrate having barrier layer 27 by using resin layer 28. Sealing substrate 29 has to be transparent.

For sealing substrate 29, glass such as alkali-free glass or alkali glass and a plastic material can be used.

For resin layer 28, the following material can be used: A photo-curing type adhesiveness resin, a heat curing type adhesiveness resin and a two-pack curing type adhesiveness resin made of an epoxy system resin, acrylic resin or silicone resin; acrylic resin such as ethylene ethyl acrylate (EEA) polymer; vinyl resin such as ethylene vinyl acetate (EVA); a polyamide; thermoplastic resin such as synthetic rubber; and thermoplastic adhesiveness resins such as acid modified matter of polyethylene and polypropylene.

A sealing substrate can be attached to a substrate by pressure using a heated roll. In addition, a sealing substrate can be affixed by irradiating ultraviolet light when a photo-curing type adhesiveness resin is used as the resin layer.

In addition, a flexible organic electroluminescence device can be made by using a flexible plastic substrate as a substrate and a sealing substrate.

Figure 7:
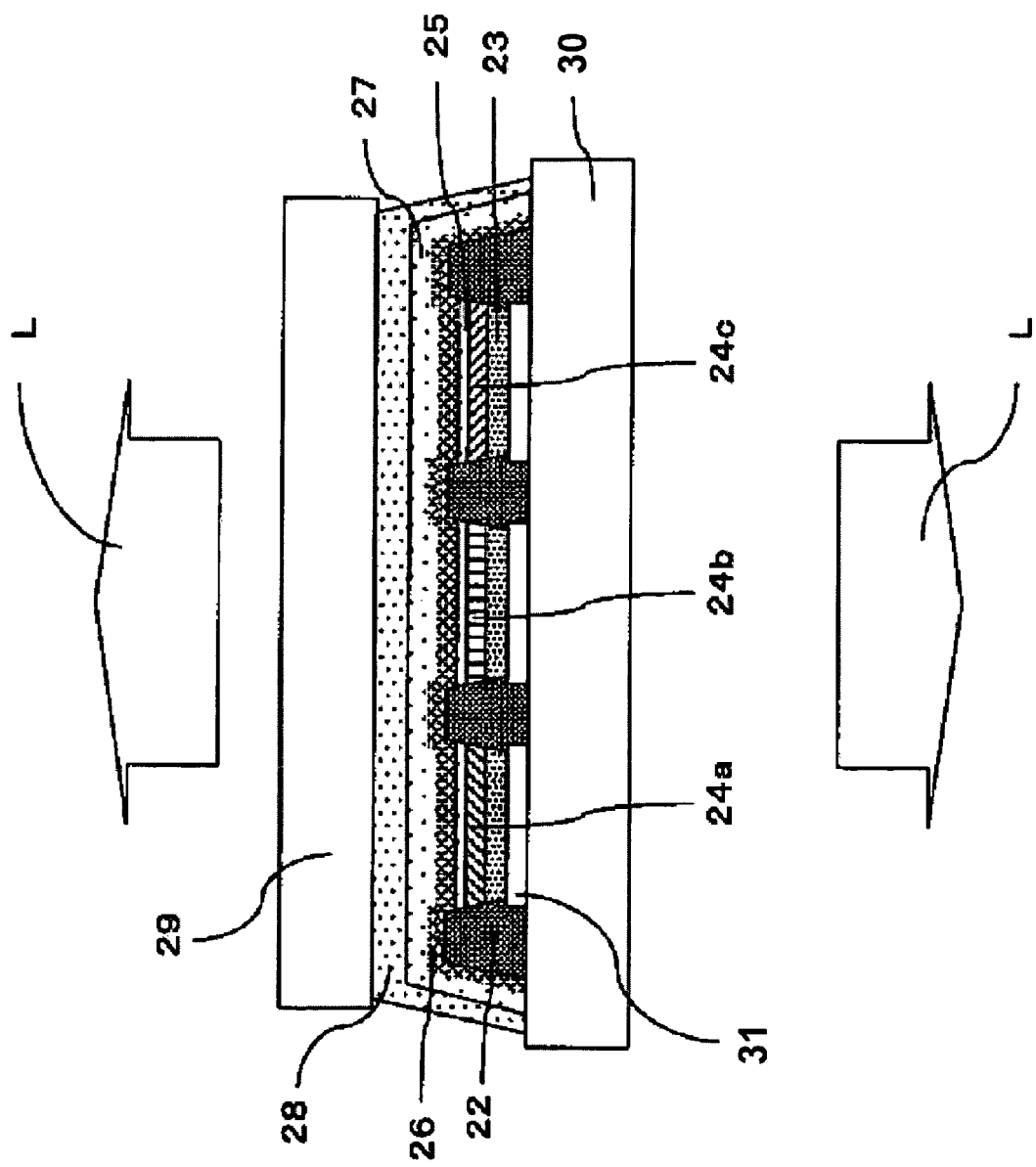
FIG. 7 is a sectional view of a transparent organic electroluminescence device.

In addition, a transparent organic electroluminescence device can be made by using transparent electrode, transparent substrate and transparent sealing material. Sectional drawing of a transparent organic electroluminescence device is shown in FIG. 7. Transparent electrode 31 is formed as a first electrode on transparent substrate 30. Partition wall 22, hole transport layer 23, organic luminescent layer (24a, 24b, 24c), electron injection protective layer 25 and transparent electrode 26 are formed over transparent substrate 30. Sealing is performed by using transparent barrier layer 27, resin layer 28 and sealing substrate 29. In a transparent organic electroluminescence device, an image can be displayed at both sides of the substrate side and the opposite side of the substrate side.

The second embodiment of the present invention is described below. In addition, the illustration that is similar to the first embodiment is omitted.

Figure 9:
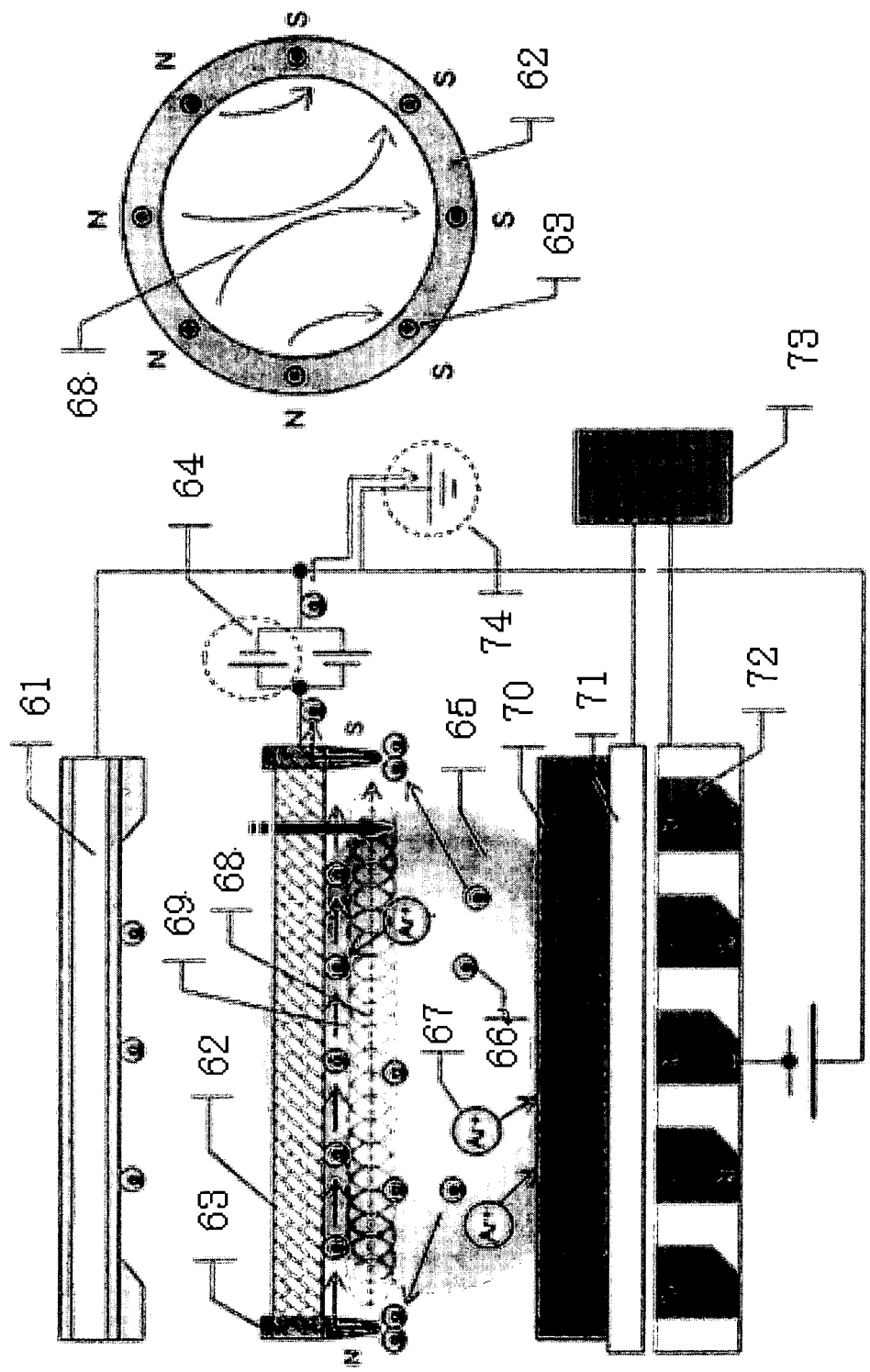
FIG. 9 is a schematic view of a DC magnetron sputtering apparatus used for a manufacturing method of a transparent conductive film of the present invention.

A schematic view of a DC magnetron sputtering apparatus used for manufacturing of a transparent conductive film of the present invention is shown in FIG. 9. Trap electrode 62 is installed between substrate 61 and target 70. Trap electrode 62 has magnet pin 63. In addition, target 70 is fixed to backing plate (OFC) 71. There is cathode magnet 72 on the bottom surface of backing plate 71. In FIG. 9, two points polarity switching devices (a trap) 64, plasma 65, Ar ion 67, chiller 73 and earth 74 are shown.

Once gas in an apparatus is exhausted in film formation so that inside of an apparatus becomes highly vacuum. Argon gas or the gas that reactive gases such as oxygen or nitrogen are added to argon gas is introduced into an apparatus so that gas pressure becomes suitable for sputtering afterwards.

Voltage is applied to trap electrode 62. Then it is possible to capture a plasma charged particle (extinction). Therefore, an impingement-rate of a plasma charged particle to a mask falls. In other words trap electrode 62 functions as a carrier trap.

Trap electrode having magnet pin 63 is installed between target 70 comprising a formation material of a transparent conductive film and a substrate.

When positive voltage is applied to a trap electrode, γ electron 66 is attracted by a top of a magnet pin by electrostatic attraction. The γ electron which is not attracted by a magnet pin is attracted by line of magnetic force 68 formed in a trap surface. Therefore, sputter damage by electron collision to a substrate and charge up of a substrate can be suppressed. Especially, when transparent conductive film is formed in the surface of an organic thin film formed on a substrate, sputter damage to an organic thin film is reduced. A transparent conductive film can be formed on an organic thin film in this way.

Line of magnetic force in the present invention is line of magnetic force formed by a magnet installed in trap electrode 62. Necessary magnetic flux density to capture γ electron and other charged particles is described below.

Larmor radius (rL) of cyclotron motion 69 is described below.

$$rL=mv/qB.$$

(v is a velocity of electron in the direction which is perpendicular to a surface of an organic thin film. m is a mass of a charged particle. q is the amount of charge. B is magnetic flux density.)

When Larmor radius is smaller than a distance between a sputtering target and a substrate, it is expected that a charged particle may be captured by line of magnetic force. So, it is necessary to decide specification and placement of a magnet to satisfy the above mentioned condition.

A specific example is shown below.

Energy of γ electron in the direction which is perpendicular to a substrate surface is 50 eV. Distance between a target and substrate is 130 mm. Magnetic flux density B is $1.8 \times 10^{-4}$ Wb/m² when the distance is equivalent to Larmor radius. This magnetic flux density can be easily generated using a marketed permanent magnet.

For a magnet, a well-known permanent magnet can be used. It is desirable to be cone shaped for a magnet. When a conical magnet is used, a plasma electron can be efficiently captured using phenomenon of an electrostatic induction.

When a transparent electrode is formed in the substrate on which organic luminescent layers are formed, substrate temperature rises by radiant heat of plasma. Then a characteristic of an organic luminescent layer on a substrate may deteriorate. In addition, when mask temperature rises, displacement between a mask and the substrate on which a transparent electrode is formed occurs by thermal expansion of a material of a mask. Therefore, it may be difficult to form a precisely shaped transparent electrode.

The occurrence of these problems can be prevented by cooling off a substrate and a mask by a Peltier element.

Figure 10:
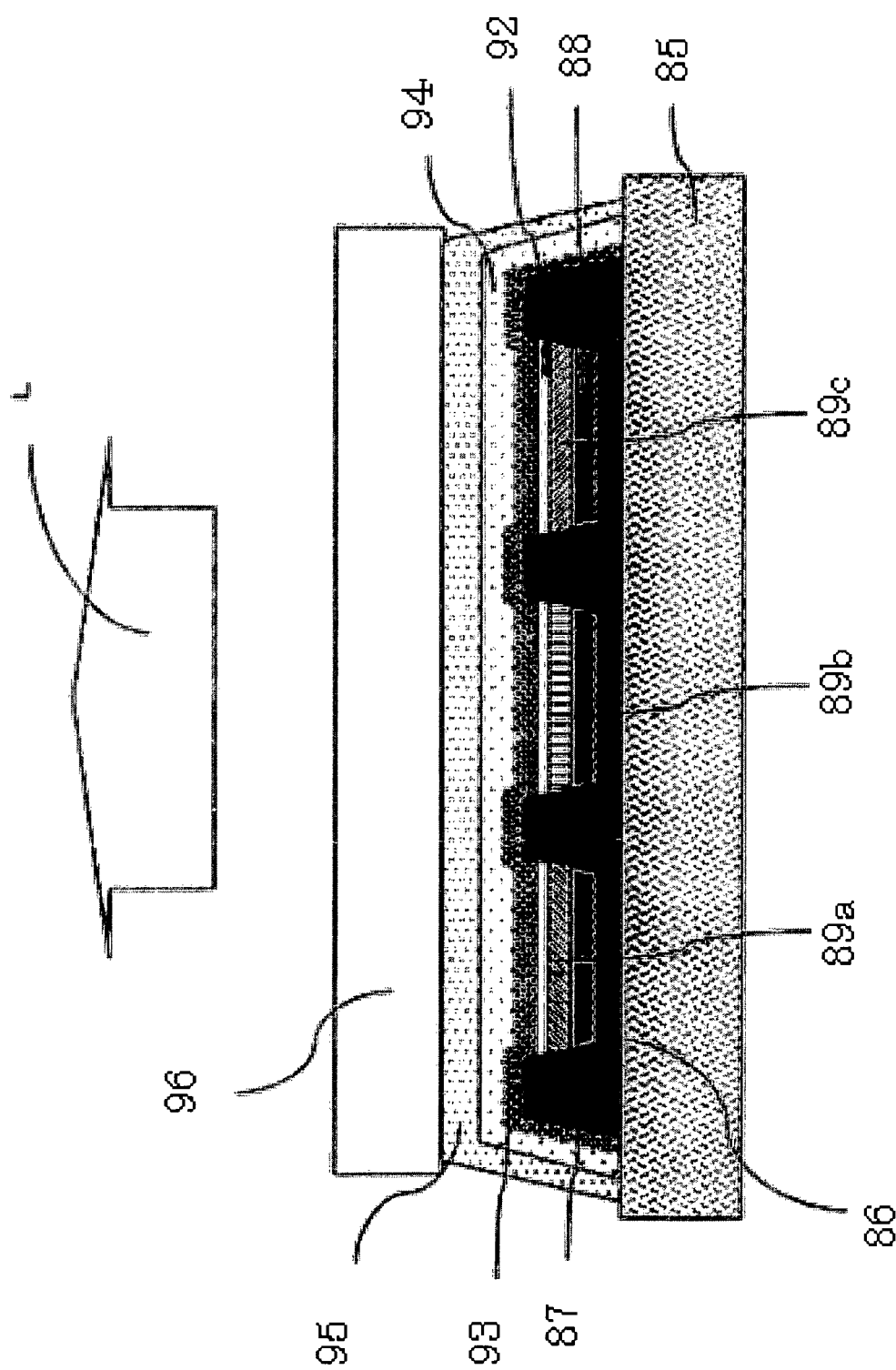
FIG. 10 is a sectional view of a top emission type organic electroluminescence device.

Sectional drawing of a top emission type organic electroluminescence device is shown in FIG. 10.

Pattern-shaped reflective electrode 86 as a first electrode is formed on substrate 85. Partition wall 87 is formed between reflective electrode 86. Hole transport layer 88 and an organic luminescent layer (89a, 89b, 89c) are formed on reflective electrode 86 in this order. Electron injection protective layer 92 and transparent electrode 93 as a second electrode are formed on an organic luminescent layer (89a, 89b, 89c). And the substrate on which reflective electrode 86, partition wall 87, hole transport layer 88, organic luminescent layer (89a, 89b, 89c), electron injection protective layer 92 and transparent electrode 93 is formed is sealed by using barrier layer 94, resin layer 95 and sealing substrate 96. In addition, the substrate on which a reflective electrode, a partition wall, a hole transport layer, an organic luminescent layer, electron injection protective layer and a transparent electrode are formed can be directly affixed to the glass substrate on which CaO is layered as desiccant.

An organic electroluminescence device of the present invention can be used as a passive matrix type organic electroluminescence device and an active matrix type organic electroluminescence device.

For thin film transistor (TFT) used for an active matrix type, thin film transistor (TFT) of amorphous silicon or a poly Si is used.

As a preferred printing process of a material of an organic luminescent layer, letterpress printing can be adopted.

Figure 11:
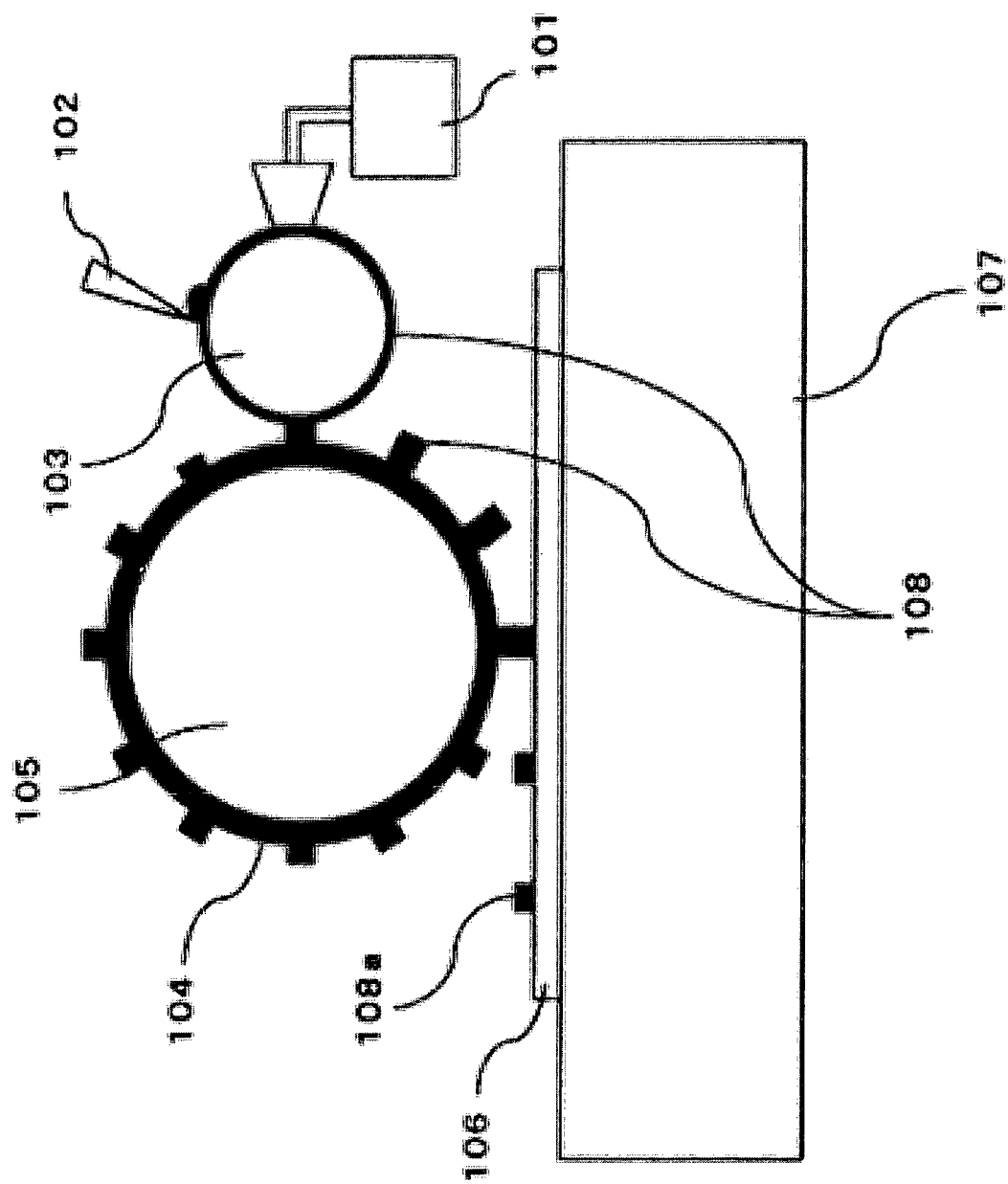
FIG. 11 is a schematic view of presswork of letterpress printing used in the present invention.

A schematic diagram of a letterpress printing machine used in the present invention is shown in FIG. 11. Substrate 106 is fixed to stage 107. Relief printing plate 104 is fixed to printing cylinder 105. Relief printing plate 104 contacts anilox roll 103 which is ink supply element. Anilox roll 103 has ink replenishing device 101 and doctor 102.

Ink is replenished from ink replenishing device 101 to anilox roll 103. Unnecessary ink of ink 108 supplied to anilox roll 103 is removed by doctor 102.

For ink replenishing device 101, ink replenishing device of drip type, Fountain roll, coater such as slit coater, die coater or cap coater or combination thereof can be used.

For doctor 102, well-known doctor such as a doctor blade or a doctor roll can be used.

In addition, for anilox roll 103, an anilox roll made of chromium or ceramics can be used. In addition, a cylinder-shaped anilox roll and flat anilox board can be used.

For example, an anilox board is placed at a position of substrate 106 in FIG. 11. Ink is replenished in whole area of an anilox board by an ink replenishing device. By a rotation of printing cylinder, ink can be supplied to a substrate afterwards.

Ink applied in the surface of anilox roll 103 uniformly by doctor transfers in projection pattern of relief printing plate 104. And while projection pattern of relief printing plate 104 touches substrate, relief printing plate 104 and substrate move in accordance with a rotation of printing cylinder 105. Ink 108 transfers in prescribed position of substrate 106. Ink pattern 108a is formed in this way on substrate.

If necessary, ink is dried by an oven after an ink pattern is formed on a substrate.

In addition, stage 107 fixing substrate 106 may move in accordance with a rotation of printing cylinder 105. A printing unit comprising printing cylinder 105, relief printing plate 104, anilox roll 103 and ink replenishing device 101 may move in accordance with a rotation of printing cylinder.

A manufacturing method of a relief printing plate is explained below. After forming the resin layer on printing cylinder 105, making a plate can be performed directly.

In addition, letterpress printing machine of FIG. 11 is single wafer processing type letterpress printing machine. However, when a substrate is a web, and a substrate can be wound off, letterpress printing machine of roll to roll can be used. When letterpress printing machine of a roll to roll method is used, an ink pattern can be formed continuously. Therefore, a manufacturing cost can be lowered.

Sealing substrate 96 is explained below.

The substrate that CaO is formed on a glass can be used as a sealing substrate. Then sealing can be performed without inserting desiccant. In addition, light absorption in a sealing substrate and change of an optical path do not occur because a substrate is directly affixed to a glass. (When glass of a cap structure is used, change of an optical path occurs.) Therefore, takeout efficiency of light can be improved.

The third embodiment of the present invention is explained in FIG. 12, FIG. 13 and FIG. 14 as follows. The illustration that is already described in the first embodiment and second embodiment is omitted.

Mask 202 for sputtering and mask frame 216 has one pair of magnet 205 comprising neodymium system alloy and the like in the lower part of mask frame 216. A high magnetic field is formed at the lower part of mask frame 216. Moving direction 210 of a secondary electron (an accelerated electron) is changed at the lower part of mask 202. In other words a charged particle (Ar ion, a secondary electron) scattered towards mask 202 from target 212 is bent in the escaping direction from mask 202 by a high magnetic field. Therefore, sputter damage by electron collision to an organic layer and charge up of a substrate can be suppressed.

In addition, when transparent conductive film is formed by a sputtering method, mask 202 and mask frame 216 may transform by radiant heat of the target 212 surface or heat of plasma exposure.

However, by the following method, this transformation can be suppressed:

1. Material which is superior in a heat radiation characteristic and of which thermal expansion is low is used as a material of a mask; and 2. Lattice-shaped crosspiece 217 is placed in an opening of mask frame 216 (FIG. 14).

A target particle gets into a gap generated between a mask and a substrate by transformation of a mask. Then a mask pattern blur occurs. However, in the present invention, this problem does not occur.

When a transparent conductive film is formed by a sputtering method, a temperature rise in the surface of target 212 due to confined plasma is controlled. Coolant flowing at the lower part of backing plate 213 is cooled to be lower than 10 degrees Celsius by chillers such as liquid nitrogen.

Mask frame 216 and sputtering apparatus 220 are explained in detail next.

Figure 12:
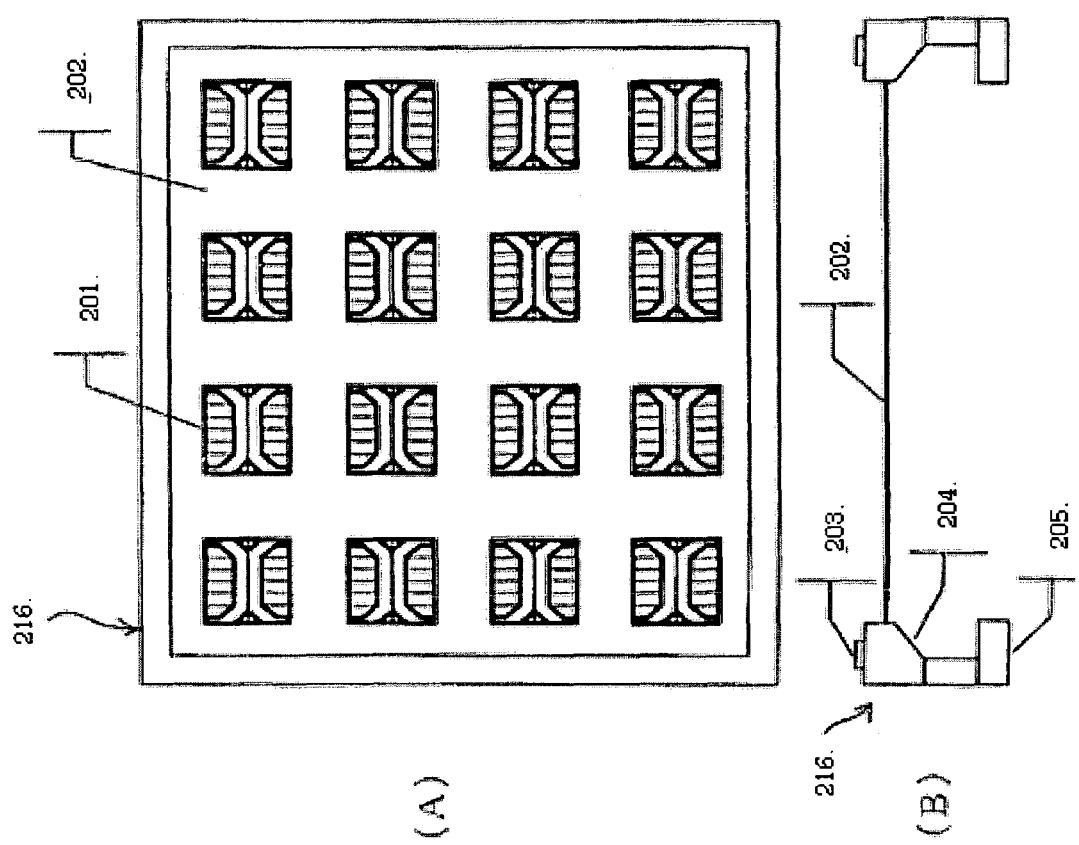
FIG. 12(A) is a mask 202 for sputtering.
FIG. 12(B) is a schematic view of mask frame 216.

As shown in FIGS. 12 (A) and (B), shape of mask frame 216 is like a rectangular frame. Mask 202 where plural mask patterns 201 is formed inward of an opening of mask frame 216 is placed. An outer circumferential part of mask 202 is fixed to mask frame 216 by mask locking screw 203. A pair of magnet 205 is installed in two parallel sides of frame 216, wherein the two parallel sides faces each other. A pair of magnet 205 is installed in a position of target 212 side of mask 202.

Line of magnetic force 207 between a pair of magnet 205 is formed along mask frame 216. The upper part of a pair of magnet 205 comprises adjustment department (45 deg.) of an incidence angle of a sputtering particle 204.

Figure 13:
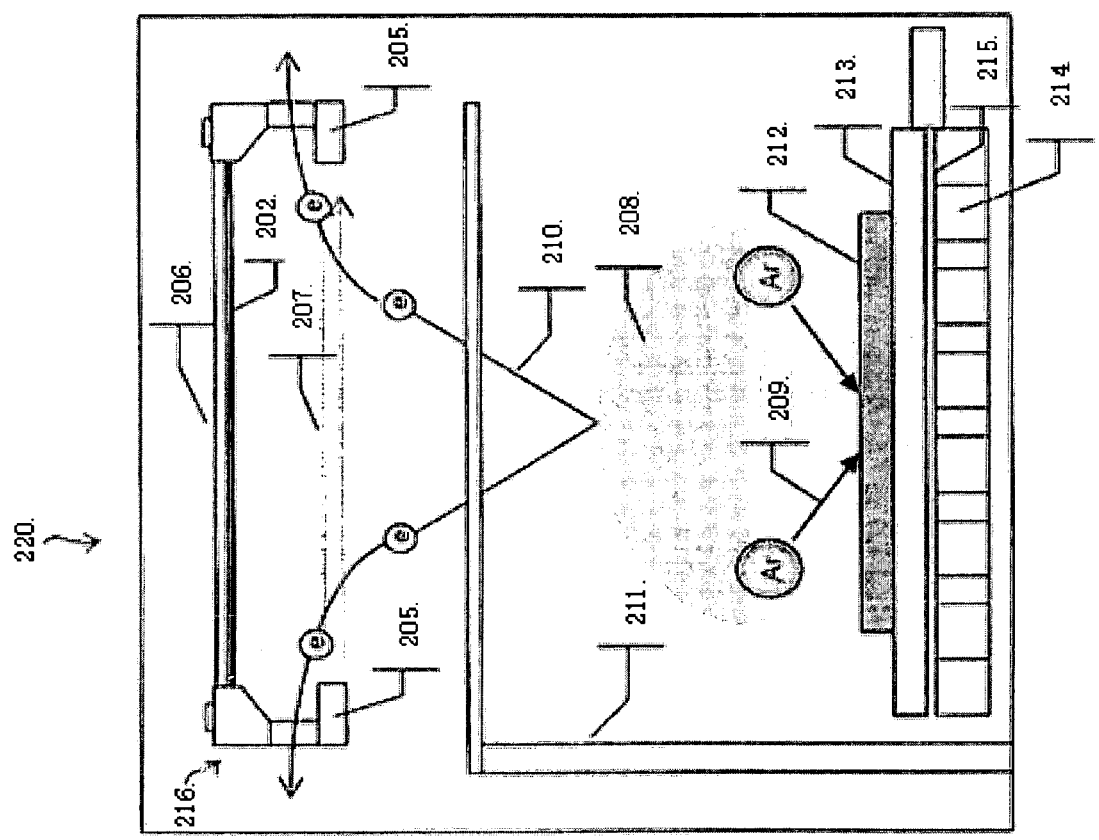
FIG. 13 is a sputtering apparatus 202 having mask 202 for sputtering and mask frame 216.
Figure 14:
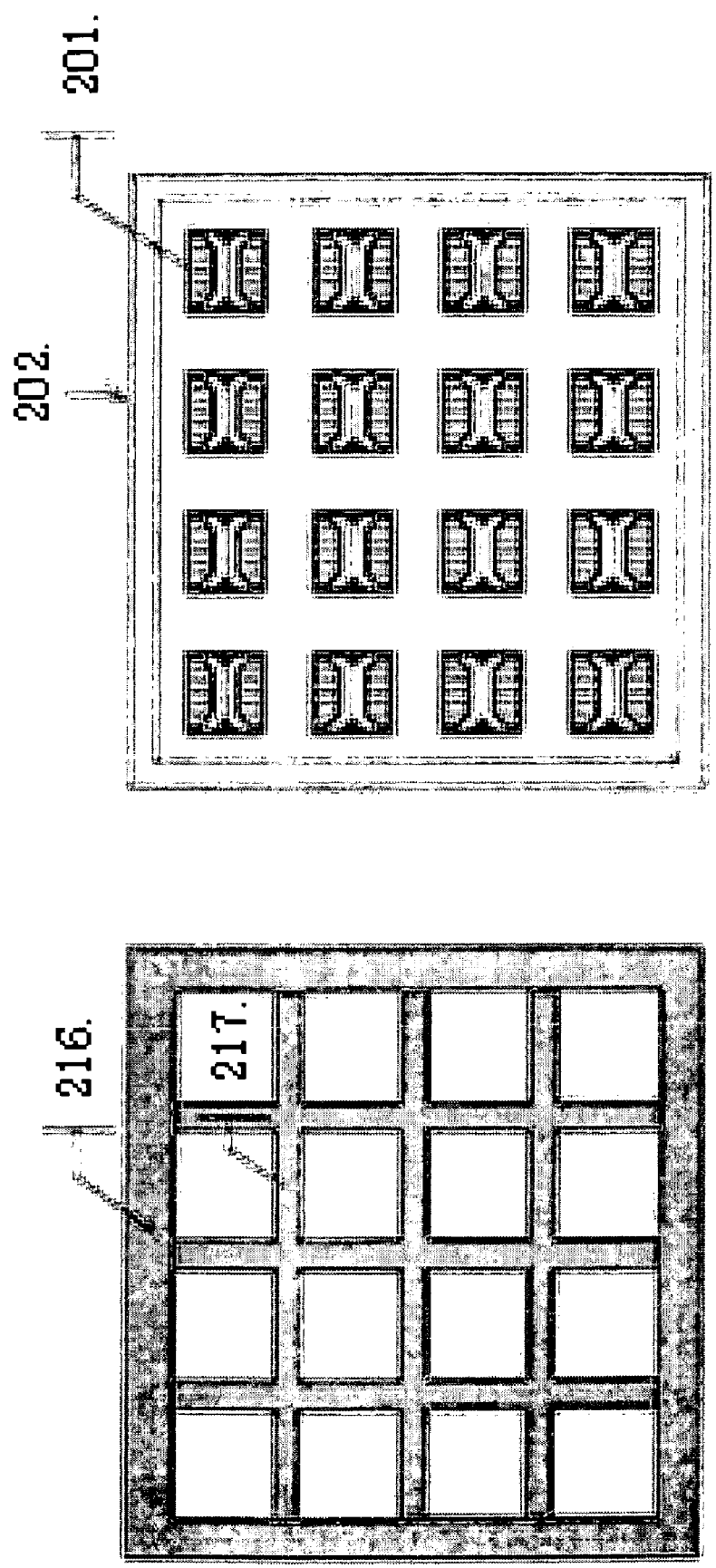
FIG. 14 is a mask frame 216 with lattice crosspiece 217 (fitted-in type) installed in an opening.

As shown in FIG. 13, glass substrate 206 is put on mask 202 attached to mask frame 216.

As shown in FIG. 13, mask frame 216 is placed in the upper part of sputtering apparatus 220. Shutter board 211, target 212, backing plate (OFC) 213 and cathode magnet 214 are placed at the lower part of mask frame 216 to face mask 202 and mask frame 216. Backing plate 213 is placed in the upper part of cathode magnet 214. Flow path 215 for coolant is formed between cathode magnet 214 and backing plate 213. Ar plasma 208 is generated over target 212 placed on backing plate 213. Therefore, Ar ion 209 is incident on target 212. Therefore, sputtering takes place.

A sputtering particle generated from target 212 moves upward. A sputtering particle is deposited on glass substrate 206 through mask frame 216. Transparent conductive film corresponding to a shape of mask pattern 201 layered in this way.

Example 1

A glass substrate was used as a substrate.

Cr as a reflective electrode (an anode) and ITO as a layer of an anodal surface boundary were formed on a substrate by a sputtering method. The laminated film of Cr and ITO was patterned by photo-lithography method. Stripe electrode was obtained in this way.

A partition wall was formed by a photo-lithography method using polyimide material so that the partition wall covers edge of stripe shaped Cr.

Ink was made by dissolving PEDOT/PSS which was a hole transport material in water next. Using this ink, a hole transport layer was formed by a spin coat method.

Ink was made by dissolving green organic luminescent material comprising poly fluorene (PF) in a toluene next. Using this ink, a stripe organic luminescent layer was formed by a letterpress reverse offset printing.

Ca and Al were formed on an organic luminescent layer in this order by a vacuum evaporation method next. For this case, an electron injection protective layer comprising Ca and Al was layered using a mask to be perpendicular to Cr stripe pattern (an anode).

A transparent electrode was formed next. As a sputtering apparatus, DC magnetron sputtering system was used. For this case, in DC magnetron sputtering system, a grid with a magnet was installed between a substrate and a target. As for the magnet on grid, bar-type was used. Magnets were placed so that central side of magnets displayed radially was N pole.

In addition, a mask was placed on substrate so that substrate touched a mask. The mask was fixed by a magnet folder.

In addition, Peltier element was placed in the surface of a substrate where transparent electrode was not formed.

In the following condition, sputtering was performed:

The gas pressure was 0.5 Pa;

A gas flow ratio is described below. $Ar/O_2=100/1.0$;

The discharge power was 0.6 kW; and

The distance between a target and a substrate was 130 mm.

For this case, the ITO (a transparent electrode) was formed to overlap an electron injection protective layer and to be perpendicular to stripe Cr (a reflective electrode). The film thickness of a transparent electrode was 150 cm.

In addition, at film formation by sputtering, the temperature of a mask was 50 degrees Celsius.

Subsequently silicon oxide film was formed by CVD method on the entire surface of a light emitting area of an organic electroluminescence device. Sealing was performed by affixing a glass substrate using an epoxy adhesive.

A top emission type organic electroluminescence device was obtained in this way.

Device characteristic of an obtained organic electroluminescence device is described below.

Maximum luminance was 2000 $cdm^{-2}$. The maximum current efficiency was 2.2 $cdA^{-1}$.

Example 2

Same as example 1, an anode, a partition wall, a hole transport layer, an organic luminescent layer and an electron injection protective layer were formed on a substrate.

A transparent electrode was formed next.

For a sputtering apparatus, DC magnetron sputtering system was used. In DC magnetron sputtering system, a circle trap made of stainless steel having a magnet pin was placed between a substrate and a target.

In addition, a mask was placed on a substrate so that a substrate touched a mask. The mask was fixed with a magnet holder.

In addition, a Peltier element was placed in the surface of a substrate where transparent electrode was not formed.

Sputtering was performed in the following condition:
The gas pressure was 1.0 Pa;
A gas flow ratio is described below. $Ar/O_2=100/1.0$;
The discharge power density was 0.21 W/cm$^2$; and
The distance between a target and a substrate was 130 mm.

The ITO (a transparent electrode) was formed to overlap an electron injection protective layer and to be perpendicular to stripe Cr (a reflective electrode). The film thickness of a transparent electrode was 150 nm.

In addition, at film formation by sputtering, the temperature of a mask was 50 degrees Celsius.

Oxidation silicon film was formed by CVD method in whole area of a light emitting area of an organic electroluminescence device next.

Subsequently sealing was performed by affixing a glass substrate using CaO film.

A top emission type organic electroluminescence device was obtained in this way.

Device characteristic of an obtained organic electroluminescence device is described below.
The maximum luminance was 2000 cdm$^{-2}$.
The maximum current efficiency was 2.2 cdA$^{-1}$.

Comparative Example 1

A reflective electrode, a partition wall, a hole transport layer, an organic luminescent layer and an electron injection protective layer were formed on a glass substrate same as example 1.

Subsequently DC magnetron sputtering system was used same as example 1, a transparent electrode was layered. But, in DC magnetron sputtering system, a magnet was not placed on a grid. In addition, a Peltier element was not placed on a substrate either. In addition, in sputtering, other sputtering conditions were the same as example 1.

For this case, the temperature of a mask at the time of sputtering was 60 degrees Celsius. The temperature of a mask was higher by 10 degrees Celsius than the temperature of a mask of example 1.

In addition, same as example 1, sealing of the substrate having a transparent electrode was performed.

An organic electroluminescence device was obtained in this way.

Device characteristic of an obtained organic electroluminescence device is described below. The maximum luminance was 200 cdm$^{-2}$. The maximum current efficiency was 0.05 cdA$^{-1}$.

Comparative Example 2

Same as example 2, a reflective electrode, a partition wall, a hole transport layer, an organic luminescent layer and an electron injection protective layer were formed on a glass substrate. Same as example 2, DC magnetron sputtering system was used, a transparent electrode was layered. But, in DC magnetron sputtering system, a circular trap was not placed between a target and a substrate. A Peltier element was not placed on a substrate either. In addition, in sputtering, other sputtering conditions were the same as example 2.

In this case, the temperature of a sputtering mask was 60 degrees Celsius. The temperature of a mask was higher by 10 degrees Celsius than the temperature of a mask of example 2.

In addition, same as example 2, sealing of a substrate having a transparent electrode was performed.

An organic electroluminescence device was provided in this way.

Device characteristic of an obtained organic electroluminescence device is described below. The maximum luminance was 200 cdm$^{-2}$. The maximum current efficiency was 0.05 cdA$^{-1}$.

What is claimed is:

1. A manufacturing method of a transparent conductive film,
    wherein a grid having a magnet is placed between a target and a substrate,
    said method includes forming a pattern shaped transparent conductive film comprising a target material over the substrate through a mask by a sputtering method.

2. The manufacturing method of a transparent conductive film according to claim 1,
    wherein the magnet is bar-type,
    wherein the magnets are placed radially over the grid,
    and wherein the polarities of the magnets in a center side of the grid are same.

3. The manufacturing method of a transparent conductive film according to claim 2,
    wherein the magnets are inserted into one or more cavity of a magnet mounting jig made of a non-magnetic material,
    and wherein the magnet mounting jig is placed on the grid.

4. The manufacturing method of a transparent conductive film according to claim 1,
    said method includes cooling the substrate by a Peltier element at the time of transparent conductive film formation.

5. A manufacturing method of an organic electroluminescence device,
    wherein the device has a first electrode, an organic luminescent layer and a second electrode in this order over a substrate,
    said method includes forming the first electrode and/or the second electrode by the manufacturing method of a transparent conductive film according to claim 1.

6. A manufacturing method of a top emission type organic electroluminescence device including a transparent electrode,
    said method includes forming the transparent electrode by the manufacturing method of a transparent conductive film according to claim 1.

7. The manufacturing method of an organic electroluminescence device according to claim 5,
    said method includes
    making an ink by dispersing or dissolving an organic luminescent layer formation material in a solvent,
    and forming an organic luminescent layer over the substrate using the ink by a letterpress reverse offset printing.

* * * * *